(12) United States Patent
Juengling

(10) Patent No.: US 6,934,928 B2
(45) Date of Patent: Aug. 23, 2005

(54) METHOD AND APPARATUS FOR DESIGNING A PATTERN ON A SEMICONDUCTOR SURFACE

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 10/229,330

(22) Filed: Aug. 27, 2002

(65) Prior Publication Data

US 2004/0044980 A1 Mar. 4, 2004

(51) Int. Cl.⁷ .............................................. G06F 17/50
(52) U.S. Cl. .......................................... 716/19; 716/21
(58) Field of Search .......................... 716/19–21; 430/5

(56) References Cited

U.S. PATENT DOCUMENTS

| 4,871,688 A | 10/1989 | Lowrey ........................ 437/47 |
| 4,957,878 A | 9/1990 | Lowrey et al. ................ 437/52 |
| 5,087,951 A | 2/1992 | Chance et al. ............. 357/23.6 |
| 5,223,083 A | 6/1993 | Cathey et al. ............... 156/643 |
| 5,358,601 A | 10/1994 | Cathey ........................ 438/721 |
| 5,625,568 A | 4/1997 | Edwards et al. |
| 5,674,785 A | 10/1997 | Akram et al. ................ 437/217 |
| 5,733,711 A | 3/1998 | Juengling .................... 430/312 |
| 5,739,585 A | 4/1998 | Akram et al. ................ 257/698 |
| 5,808,360 A | 9/1998 | Akram ........................ 257/738 |
| 5,821,014 A | 10/1998 | Chen et al. |
| 5,834,366 A | 11/1998 | Akram ........................ 438/614 |
| 5,840,598 A | 11/1998 | Grigg et al. |
| 5,871,870 A | 2/1999 | Alwan |
| 5,885,734 A * | 3/1999 | Pierrat et al. ................. 716/19 |
| 5,925,410 A | 7/1999 | Akram et al. ................ 427/240 |
| 5,959,347 A | 9/1999 | Grigg et al. |
| 5,976,964 A | 11/1999 | Ball ........................... 438/613 |
| 6,008,070 A | 12/1999 | Farnworth ................... 438/114 |
| 6,013,948 A | 1/2000 | Akram et al. ................ 257/698 |
| 6,030,731 A | 2/2000 | Yang .............................. 430/5 |
| 6,034,440 A | 3/2000 | Ball |
| 6,063,650 A | 5/2000 | King et al. |
| 6,083,767 A | 7/2000 | Tjaden et al. ................. 438/20 |
| 6,093,655 A | 7/2000 | Donohoe et al. ........... 438/717 |
| 6,121,070 A | 9/2000 | Akram |
| 6,143,580 A | 11/2000 | Wells et al. .................. 438/20 |
| 6,165,887 A | 12/2000 | Ball ........................... 438/613 |
| 6,184,064 B1 | 2/2001 | Jiang et al. ................. 438/113 |
| 6,206,754 B1 | 3/2001 | Moore .......................... 451/8 |
| 6,213,845 B1 | 4/2001 | Elledge ........................ 451/6 |
| 6,234,878 B1 | 5/2001 | Moore ......................... 451/41 |
| 6,238,273 B1 | 5/2001 | Southwick ................... 451/41 |
| 6,248,611 B1 | 6/2001 | Grigg et al. ................. 438/106 |
| 6,269,472 B1 | 7/2001 | Garza et al. |
| 6,370,679 B1 * | 4/2002 | Chang et al. ................. 716/19 |
| 6,421,820 B1 | 7/2002 | Mansfield et al. |
| 6,425,117 B1 * | 7/2002 | Pasch et al. .................. 716/21 |

(Continued)

Primary Examiner—Matthew Smith
Assistant Examiner—Paul Dinh
(74) Attorney, Agent, or Firm—Schwegman, Lundberg, Woessner & Kluth, P.A.

(57) ABSTRACT

A method of forming a pattern of elements is shown. In one embodiment, the method is used to create a reticle. In another embodiment, the method is used to further form a number of elements on a surface of a semiconductor wafer. Identified problem structures or regions in a pattern of elements are moved from lower level cells of a hierarchy structure into higher level cells before edge movement takes place. Because all cells have been selectively leveled first, substantially all external influences to cells have been removed for each cell before edge movement takes place. The methods and procedures described herein therefore reduce the possibility of undesirable modifications such as electrical shorts. The methods and procedures described herein also reduce overall processing time.

67 Claims, 10 Drawing Sheets

U.S. PATENT DOCUMENTS

| | | |
|---|---|---|
| 6,457,157 B1 | 9/2002 | Singh et al. |
| 6,470,489 B1 * | 10/2002 | Chang et al. .................. 716/21 |
| 6,584,610 B1 * | 6/2003 | Wu et al. ...................... 716/19 |
| 6,667,531 B1 | 12/2003 | Ireland et al. ............... 257/510 |
| 6,732,345 B2 | 5/2004 | Kato |
| 6,753,115 B2 | 6/2004 | Zhang et al. |
| 6,782,524 B2 | 8/2004 | Rittman |
| 6,795,961 B2 | 9/2004 | Liebmann et al. |
| 2001/0002304 A1 | 5/2001 | Pierrat et al. |
| 2001/0005566 A1 | 6/2001 | Kotani et al. |
| 2001/0013115 A1 | 8/2001 | Juengling |
| 2003/0118917 A1 | 6/2003 | Zhang et al. |
| 2003/0149955 A1 | 8/2003 | Ohnuma |
| 2003/0152843 A1 | 8/2003 | Tang |
| 2004/0019868 A1 | 1/2004 | Li |
| 2004/0181765 A1 | 9/2004 | Kato |

* cited by examiner

METHOD AND APPARATUS FOR DESIGNING A PATTERN ON A SEMICONDUCTOR SURFACE

CROSS-REFERENCE TO RELATED APPLICATIONS

This application is related to the following co-pending, commonly assigned U.S. patent application Ser. No. 10/232,853: "Pattern Generation on a Semiconductor Surface," of which the disclosure is herein incorporated by reference in its entirety.

FIELD OF THE INVENTION

The invention relates to semiconductor devices and device fabrication. Specifically, the invention relates to designing patterns of elements for use on a surface of a semiconductor wafer.

BACKGROUND OF THE INVENTION

In fabricating integrated circuits (IC's) on a surface of a semiconductor wafer, a number of electronic devices are formed on or within the surface of the wafer. Any of a number of electronic devices may be formed on the surface of the wafer, such as transistors, capacitors, diodes, etc. Electronic devices include active areas such as a body region of a transistor, or a source/drain region of a transistor.

After the individual electronic devices are formed on the surface of the wafer, selected electronic devices must be interconnected to form the IC. One typical approach to interconnecting electronic devices is to deposit metal interconnect traces on the surface of the wafer, usually on top of the electronic devices. The interconnect traces typically take the form of trace lines, with a line width that is generally consistent along a length of the trace line. The traces connect at least one active region of a first electronic device with an active region of a second electronic device, allowing the devices to communicate with one another, and perform complex operations such as processing or storing information.

Trace lines, however, create a rough surface on the wafer with the trace lines as high points, and the spaces between traces as low points. In many IC designs, there is a need to form a substantially planar surface on the wafer over the trace lines. For example, most IC designs stack multiple layers of electronic devices on top of each other. Layers of trace lines interconnect electronic devices on each respective layer, frequently with vias connecting between layers. The surface of each trace line layer must be substantially planar, and electrically isolated in order to form subsequent layers of electronic devices.

One approach in the industry has been to deposit an inter layer dielectric (ILD) over the trace lines. The ILD electrically isolates the trace line layer, and it can be planarized to form the necessary surface for subsequent layers. Current devices and methods design a pattern of trace lines that merely considers electrical connection of electronic devices. The effects of the chosen pattern on subsequent wafer fabrication steps such as deposition of an ILD layer is not currently considered. Current devices and methods require multiple steps and multiple layers for effective isolation and planarization of the trace line layer. Current devices and methods also produce significant variation in ILD thickness. Current devices and methods are thus more costly due to additional fabrication steps, and less reliable due to resulting thickness variations. Thick ILD layer regions are undesirable, because formation of subsequent vias is difficult due to the extra distance that the vias must tunnel through. Variation in ILD thickness is undesirable because, among other problems, subsequent via etching must either under etch thick regions, or over etch thin regions of the ILD.

As discussed in commonly assigned, co-pending applications, the design of the pattern of elements can influence the effectiveness of subsequent operations such as deposition of ILD layers. Computer programs exist that are used to generate patterns of elements such as trace lines, and can be used to modify planned patterns of elements. The computer programs typically generate a pattern for a chip or an entire die using combinations of smaller pattern organization devices called cells. A cell can contain shapes or instances, or both shapes and instances. A shape is defined as a collection of data that defines geometry of a structure such as a trace line. An instance is defined as data indicating a placement of another cell within the current cell, but not including the actual shape geometry data. Cells are arranged in a hierarchy that includes low level cells, intermediate level cell, high level cells, etc. High level cells typically include large numbers of lower level cells, and the relationship of lower level cells within high level cells is frequently complicated. The use of cells arranged in a hierarchy is convenient for designing and making modifications to a pattern of elements, because repeating modifications can be made at the appropriate level within the hierarchy, and the changes will be repeated throughout similar level cells. Recognizing and utilizing repeating patterns reduces processing time for a computer or similar data processor during the design and modification process.

A problem arises, however, when performance of a selected cell in a selected level within the hierarchy is influenced by factors external to the selected cell, such as factors from a separate adjacent cell. Without knowledge of the characteristics of cells external to a selected cell or cells, modifications can fail to accomplish the design goals of the modification, or the modification can introduce new problems in the pattern of elements.

What is needed is a method of design and modification for patterns of elements that allows consideration of a region within the pattern that is inclusive enough to encompass substantially all relevant features so that they can be considered in design and modification. What is also needed is a method of design and modification with a short processing time.

SUMMARY OF THE INVENTION

A method of forming a pattern of elements for use on a semiconductor wafer is shown. In one embodiment, the method includes generating a number of cells organized in a hierarchy. The method also includes identifying a first cell including a region to be modified on a first hierarchy level and identifying a second cell on a second hierarchy level that influences characteristics of the first cell. The method also includes moving at least a portion of the first cell from the first hierarchy level to a higher level cell in the hierarchy that is common with the second cell. The method also includes moving at least a portion of the second cell from the second hierarchy level to the higher level cell, wherein the higher level cell is free of external influences. The method also includes modifying the higher level cell.

A machine-readable medium with instructions stored thereon is shown. When the instructions are executed, in one embodiment, they cause generation of a number of cells organized in a hierarchy. The instructions also cause identification of a first cell including a region to be modified on a first hierarchy level and identification of a second cell on a second hierarchy level that influences characteristics of the first cell. The instructions also cause moving of at least a portion of the first cell from the first hierarchy level to a higher level cell in the hierarchy that is common with the second cell. The instructions also cause moving of at least a portion of the second cell from the second hierarchy level to the higher level cell, wherein the higher level cell is free of external influences. The instructions also cause modification of the higher level cell.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1A:
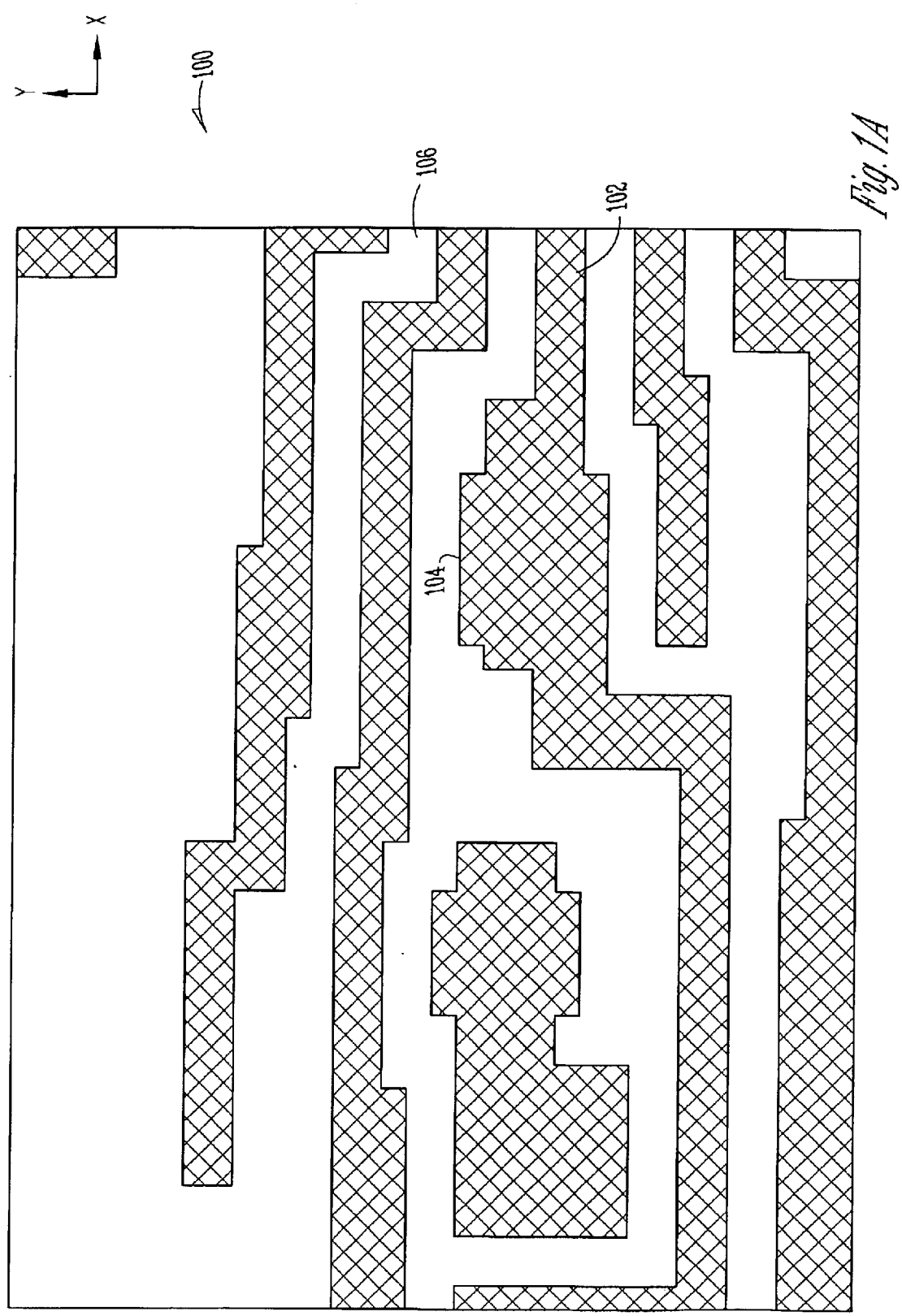
FIG. 1A shows an embodiment of a planned surface of a semiconductor wafer with a number of elements and spaces defined.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Embodiments as described below include a new hierarchy management that leaves cellview placements unchanged, but moves shapes into a higher level of the hierarchy to account for neighboring cell views and metal shapes in higher hierarchy cells. One embodiment of the hierarchy management flattens cells specific to the design (contacts, vias, core cells, etc.). One embodiment of the hierarchy management levels a shapes area by moving all interacting (butting, overlapping, etc.) shapes of the area upwards in the hierarchy until they are connected. One embodiment of the hierarchy management generates a ring which consists of butting edges between selected regions to verify that a TODO area is completely surrounded by other areas and levels this ring into the hierarchy of the area. In one embodiment of the hierarchy management, all TODO areas are split into shapes which are completely inside certain cells. In one embodiment of the hierarchy management, TODO areas are not split up between different cells or in different hierarchy levels. In one embodiment of the hierarchy management, an algorithm such as Cadence DIVA/ SKILL is invoked to fill the structure. In one embodiment of the hierarchy management, the Cadence DIVA/SKILL program is used to check the results of the new hierarchy management.

FIG. 1A shows a first planned surface 100 of a semiconductor wafer. In one embodiment, the first planned surface 100 is not in a final state. In one embodiment, the first planned surface has not been put into a permanent physical form such as in a reticle for photolithographic processing, or a pattern of physical trace lines. In one embodiment, the first planned surface 100 is defined by data stored on a machine readable media, such as a computer memory, a hard disk drive, a floppy disk, optical storage, other storage media, etc.

The first planned surface 100 includes a number of conductive elements 102, each defined by a number of edges 104. In one embodiment, the conductive elements include a metal. In one embodiment, a single element metal, such as aluminum is used. In one embodiment, a metal is included in an alloy. Other conductive materials are also possible, such as semiconductors. In one embodiment, the conductive elements 102 include trace lines. In one embodiment, the conductive elements 102 are adapted to interconnect at least a pair of active regions, such as source/drain regions of transistors. In one embodiment, the conductive elements 102 of the first planned surface 100 are located based primarily on electrical considerations of interconnecting a number of active regions. In FIG. 1A, the edges 104 of the conductive elements 102 define a number of spaces 106 between elements. Along a chosen direction, such as a Y-direction, a dimension of the spaces 106 can be measured.

Figure 1B:
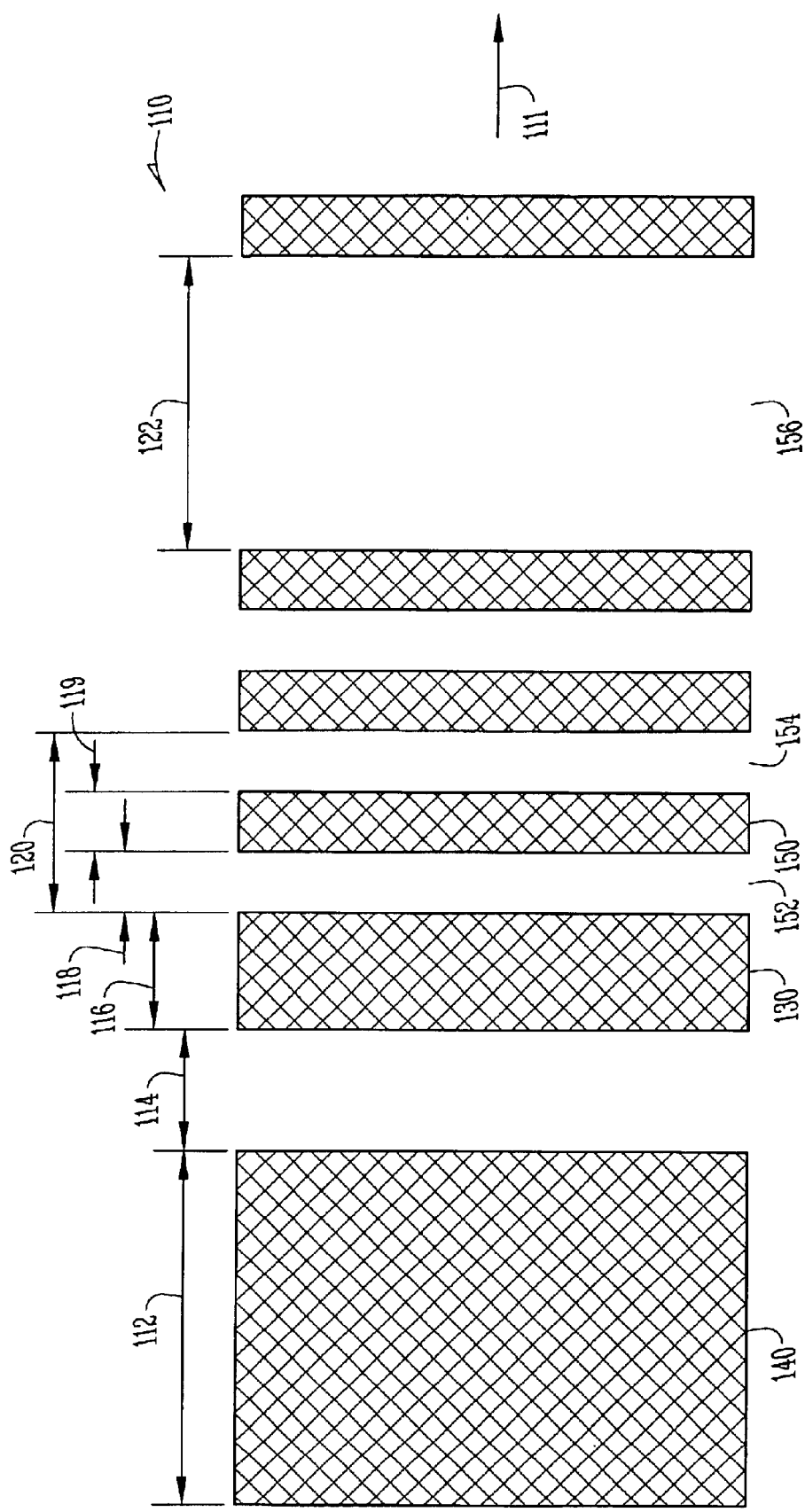
FIG. 1B shows an embodiment of a planned surface of a semiconductor wafer with a number of elements and spaces defined.

FIG. 1B shows a number of elements 110 which are shaped in rectangles for ease of illustration. One embodiment of the invention includes a set of dimensional rules that apply to elements such as the number of elements 110. The following description of dimensional rules between elements 110 is applicable to the conductive elements 102 shown in FIG. 1A. In FIG. 1B, all dimensions are measured along direction 111. One of ordinary skill in the art, with the benefit of the present disclosure, will recognize that although the single direction 111 is shown in FIG. 1B, the rules described herein regarding element and space dimensions are applicable to any chosen measurement direction in a pattern of elements.

Element 130 is shown with a threshold dimension 116. Element 140 is shown with a second dimension 112 that is greater than the threshold dimension 116. Element 130 is shown separated from element 140 by a DRC gap 114. In one embodiment, the DRC gap is defined as the minimum spacing dimension that can be located adjacent to an element with an element dimension larger than the threshold dimension 116. As shown, element 140 includes the second dimension 112 that is larger than the threshold dimension 116, therefore the minimum separation between elements 140 and 130 is the DRC gap 114.

Element 150 is shown with a third dimension 119 that is smaller that the threshold dimension 116. In one embodiment, the third dimension 119 is defined as a minimum lithographic line width. Element 150 is shown directly adjacent to a first space 152 and a second space 154. The first space 152 is shown with a minimum space dimension 118. In one embodiment, the first space 152 and the second space 154 have substantially the same minimum space dimension 118. An SLS dimension 120 is defined as being substantially equal to a space+line+space (SLS) where the line is the minimum lithographic line dimension, and the two adjacent spaces are both equal to the minimum lithographic space as formed when adjacent to a minimum lithographic line dimension.

It should be noted that the minimum space dimension 118 is smaller than the DRC gap 114. This is allowed due to lithographic techniques that allow thin spaces, but only when they are adjacent to elements thinner than a certain dimension. In one embodiment, elements that are thin enough to be located next to a space smaller than DRC gap 114 must have element dimensions in a limited range. In one embodiment, the limited range includes the minimum lithographic line width 119 and the limited range can be as large as the threshold dimension 116.

A third space 156 is further shown in FIG. 1B with a dimension 122 that is greater than the SLS dimension 120. In one embodiment, a FLOAT area is defined as an area with dimensions that are large enough to allow insertion of at least one element within the FLOAT area while complying with the above described dimensional rules. Additional elements within a FLOAT area, in one embodiment, are referred to a floating elements because they are not coupled to any active areas of electronic devices. The additional elements are electrically "floating" on top of an isolated substrate region. In one embodiment, floating elements are included to improve subsequent ILD layer deposition kinetics as discussed below.

In FIG. 1B, the dimension 122 of the third space 156 allows insertion of an additional element, and thus qualifies as a FLOAT space dimension. It should be noted that the smallest dimension of a FLOAT area dimension depends on the dimensions of the elements that surround the area. The minimum lithographic line width 119 remains the same in one embodiment for all configurations. However, according to the dimensional rules above, if surrounding elements include one or more "large" elements with dimensions greater than the threshold dimension 116, then the DRC gap 114 is needed adjacent to the floating element. Likewise, if surrounding elements include one or more elements with dimensions less than or equal to the threshold dimension 116, then a space as small as the minimum space dimension 118 can be used. In one embodiment, a FLOAT area includes both DRC gap 114 dimensions surrounding a floating element and minimum space dimensions 118 surrounding the floating element.

A TODO area is defined as a space between elements with at least one dimension that is larger than DRC gap 114 where the space is also not large enough to insert a floating element under the above dimensional rules. TODO areas are located in a pattern of elements and modified to provide for an improved ILD process as described below.

Dimensional rules such as the rules described above are driven by subsequent wafer processing steps in one embodiment. As discussed above, it is often desirable to form subsequent structure such as an inter layer dielectric (ILD) between elements on a wafer, such as conductive elements 102 from FIG. 1A. In many designs, the ILD must be substantially planar, and a thin, consistent ILD layer is more desirable due to subsequent addition of conductive vias through the ILD.

It has been discovered that the deposition process of an ILD layer using processes such as spin-on-glass or CVD is not isotropic. Spaces of different sizes and dimensions fill at different rates. Anisotropic fill rates are minimized by controlling space dimensions, which leads to a more consistent, planar ILD surface, and a more simple fabrication process for deposition and planarization of the ILD surface. Dimensional rules, in one embodiment, are chosen based on these ILD fill dynamics considerations. Dimensions such as the DRC gap 114, the minimum space dimension 118, etc. provide an ILD deposition process requiring fewer steps, resulting in a thinner, more planar, more consistent ILD layer that is more reliable. Likewise, in one embodiment, the addition of floating elements is driven by the desire for spaces between elements in a pattern that are more easily filled and planarized in a subsequent ILD process. In one embodiment, a pattern of elements utilizing dimensional rules as described above can be filled and planarized in a single processing operation.

Figure 1C:
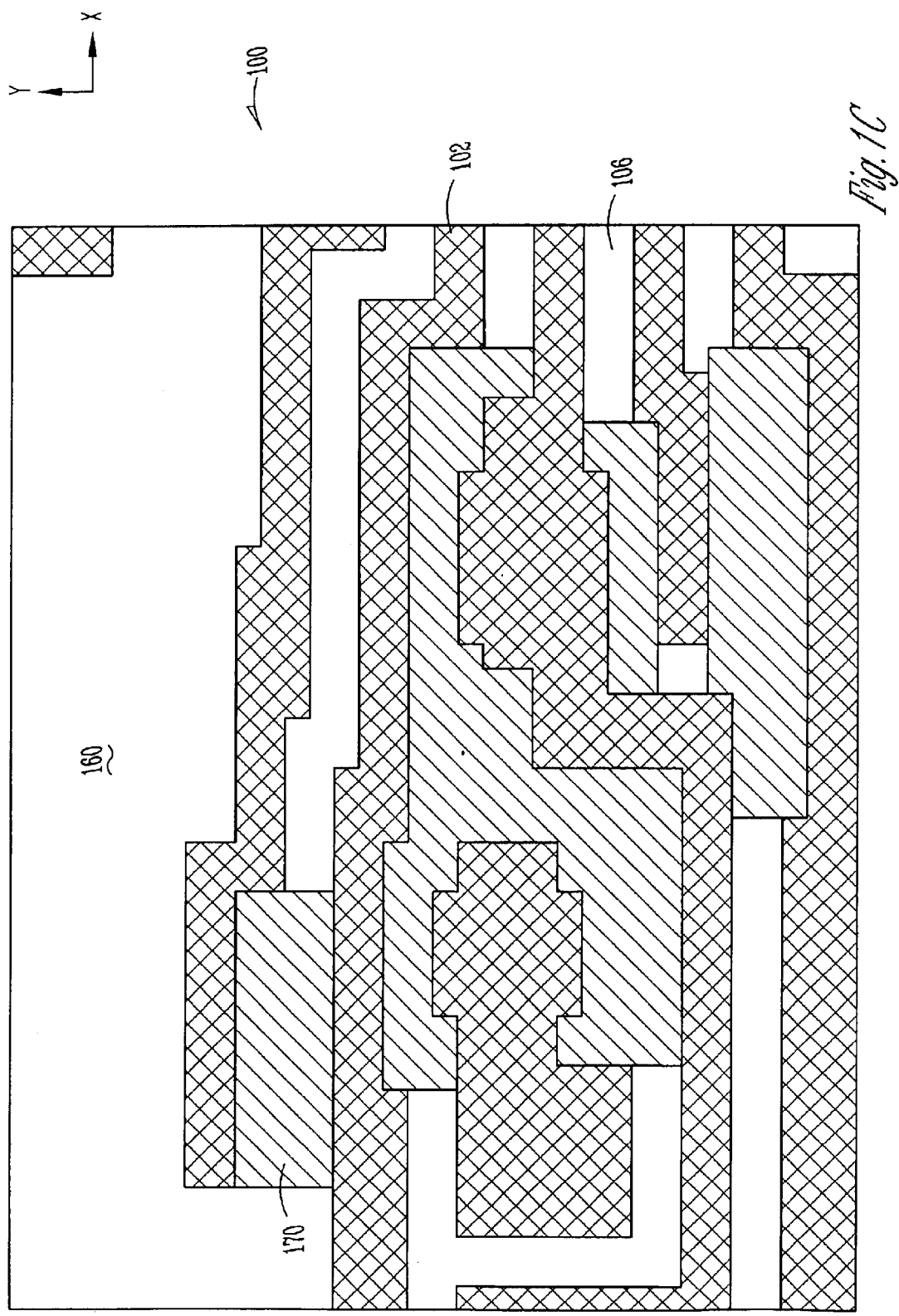
FIG. 1C shows an embodiment of a planned surface of a semiconductor wafer with additional regions defined.

FIG. 1C shows the spaces 106 of FIG. 1A further divided into categories based on the dimensions of the spaces 106 and the dimensional rules above. The first planned surface 100, in FIG. 1C, shows a FLOAT region 160. The first planned surface 100 in FIG. 1C also includes a number of TODO regions 170. In one embodiment, the dimensions of elements and spaces in the first planned surface 100 are measured substantially along X and Y directions as indicated in the Figures. One skilled in the art, having the benefit of the present disclosure, will recognize that a dimension of the spaces 106 can be alternatively measured on any of a wide range of directions other than X and Y directions. Further, the spaces 106, in embodiments such as the one shown in FIG. 1A and FIG. 1C, frequently include complex shapes, that contain a number of widths in any given direction, depending on the particular portion of the space 106 that is measured.

As described in the co-pending application "Pattern Generation on a Semiconductor Surface," Edges of elements surrounding TODO regions are moved using a set of movement rules to form a pattern of elements with spaces between elements that conform to dimensional rules as described above. Although a specific set of dimensional rules is shown that drives modification of elements, embodiments of the present invention are useful with any of a number of possible dimensional rules or movement rules. The edge movement process pursuant to a given set of movement rules frequently uses a considerable amount of processor time in the computing environment. If the movement process is performed at each level, consecutively within the hierarchy of cells, the process of moving edges of elements for an entire die can take as long as seven hours. The processing time needed is made longer due to a problem with certain TODO regions in adjacent cells on different levels in the hierarchy.

Figure 2:
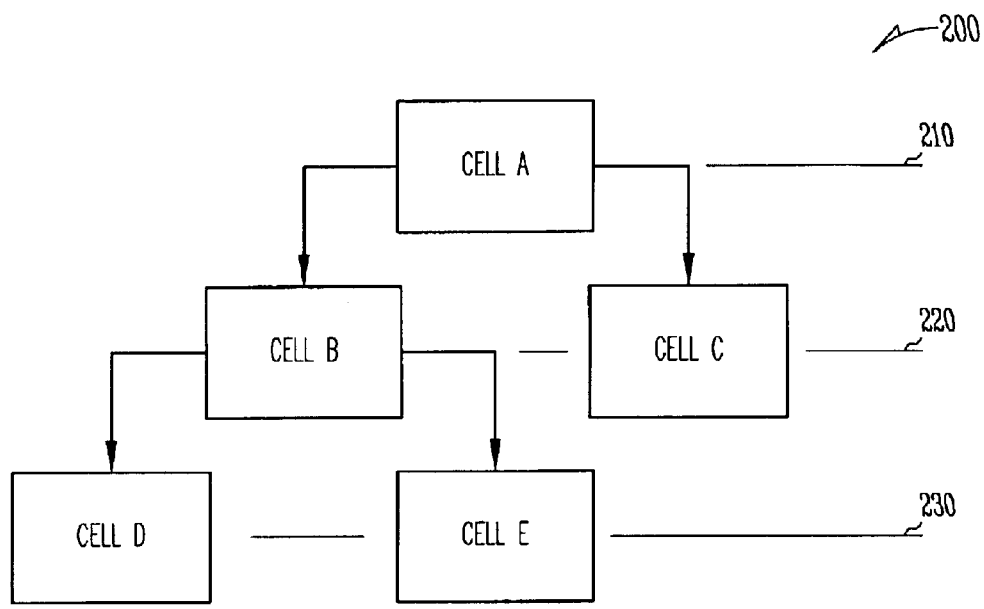
FIG. 2 shows a hierarchy structure.
Figure 3A:
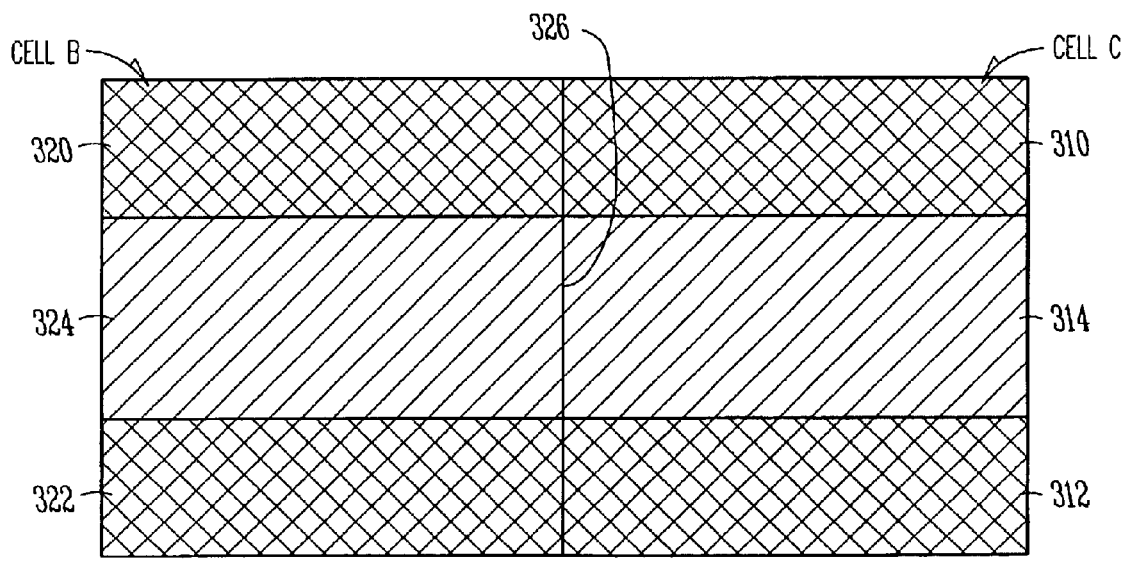
FIG. 3A shows a pair of cells.

FIG. 2 shows one embodiment of a simple hierarchy 200 that includes Cell A in a high level 210. Cell B and Cell C are intermediate level cells that are included within Cell A on level 220. Cell D and Cell E are further included within Cell B on a lower level 230. FIG. 3A shows the shapes of Cell B and Cell C together for purposes of illustration. In the current hierarchy structure, when viewing or modifying Cell B, the shapes in Cell B would visible along with shapes below Cell B in the hierarchy, such as any shapes in Cell D or Cell E. Shapes in Cell C, however, would not be visible, because Cell B and Cell C are only linked at level 210 of the hierarchy through Cell A. The shapes of Cell B and Cell C are shown together in FIG. 3A to illustrate a problem that occurs when cells are modified separately without knowledge of each other or their influence on each other.

Cell C includes a first element 310, a second element 312, and a TODO space region 314 between the first and second elements 310, 312. Likewise Cell B includes a first element 320 and a second element 322 with a TODO space 324 between. The TODO space 314 of Cell B shares a boundary 326 with the TODO space 324 of Cell B.

Figure 3B:
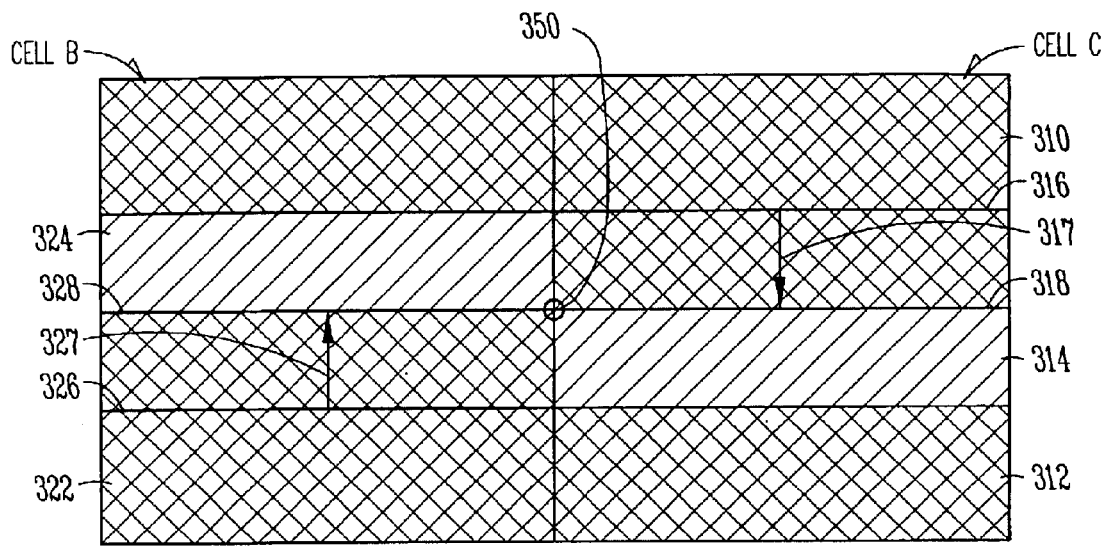
FIG. 3B shows the pair of cells from FIG. 3A after a first modification.

FIG. 3B shows Cell B and Cell C after a modification. If cells are modified by themselves, without all relevant information external to the level, a problem as illustrated in FIG. 3B can develop. TODO region 324 of Cell B is modified by moving edge 326 of element 322 along direction 327 to a new location 328. The new location 328 of the edge complies with the dimensional rules as discussed above. Likewise progressing through the level 220, Cell C is later modified without knowledge of Cell B. In modifying Cell C, TODO region 314 is modified by moving edge 316 of element 310 along direction 317 to a new location 318. The new location 318 of the edge also complies with the dimensional rules as discussed above. However, because Cell B was modified without knowledge of Cell C, and Cell C was likewise modified without knowledge of Cell B, An undesirable condition such as an electrical short at point 350 has been created.

Figure 3C:
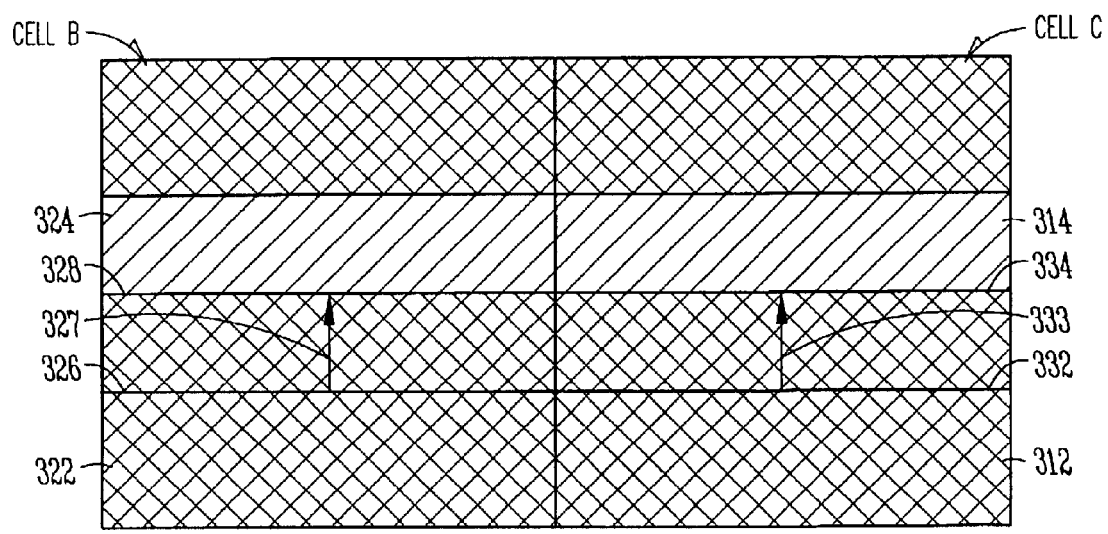
FIG. 3C shows the pair of cells from FIG. 3A after a second modification.

FIG. 3C shows one embodiment of a desirable condition after modifying the TODO region 314 of Cell C, and the TODO region 324 of Cell B. Similar to FIG. 3B, TODO region 324 is modified by moving edge 326 of element 322 along direction 327 to a new location 328. However, in Cell C, the TODO region 314 is modified by moving edge 332 of element 312 along direction 333 to a new location 334. The resulting pattern in the two cells conforms to dimensional rules as described above, and does not create undesirable conditions such as an electrical short.

Because modifications on multiple levels of the hierarchy consume large amounts of processor time, a new method that reduces processor time is desirable. Further, as discussed above, factors external to individual levels in a hierarchy have an effect on other levels in the hierarchy that can lead to negative designs, such as a short.

Figure 4:
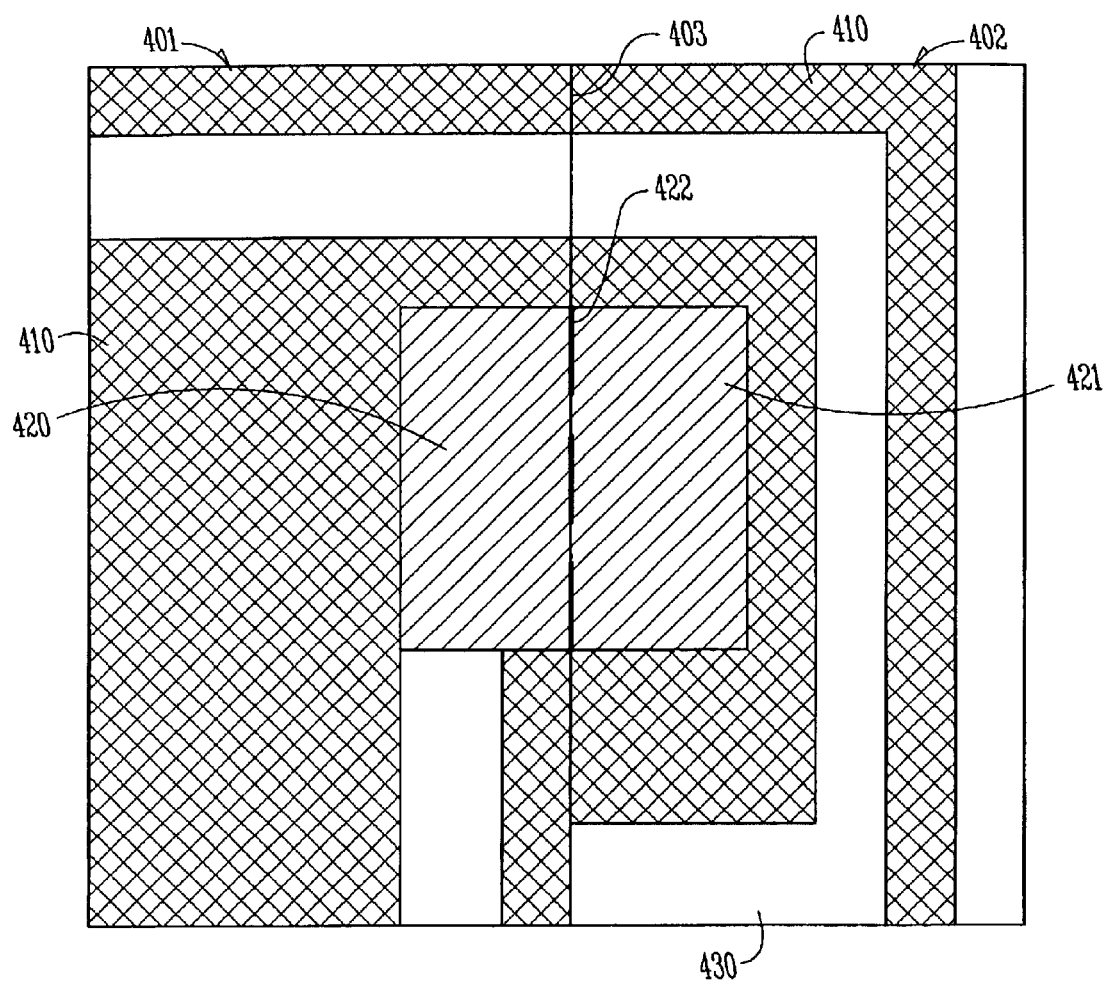
FIG. 4 shows a pair of cells.

FIG. 4 shows a first cell 401 and a second cell 402. In one embodiment, the first cell 401 is organized in a hierarchy structure where it cannot see the second cell 402. However, similar to FIGS. 3A–3C, FIG. 4 shows the shapes of the first cell 401 and the second cell 402 together for purposes of illustration. When shown together, the first cell 401 abuts the second cell 402 along line 403. The cells 401 and 402 contain data for forming a number of elements 410, a first TODO region 420, a second TODO region 421, and a number of spaces that conform to dimensional rules 430. In one embodiment, the number of elements include conductive trace lines, although the invention is not so limited. Any of a number of patterns of elements that benefit from improved subsequent layer deposition/planarization will benefit from embodiments of the present disclosure.

In one embodiment, each cell is assessed by checking borders of TODO regions. In FIG. 4, the first TODO region 420 in the first cell 401 is bounded by an element 410, a space that conform to dimensional rules 430, and one edge of the TODO region is located on the edge of the first cell 401. When the first cell 401 is seen by itself, without knowledge of abutting cells, the type of element or region located on one edge of the TODO region 420 is therefore not known. When viewing both the first cell 401 and the second cell 402 together, the first TODO region 420 is shown to share a border 422 with the second TODO region 421. As illustrated in one possible example from FIGS. 3A–3C, a TODO region that has a boundary across cells can create undesired problems such as electrical shorts.

In one embodiment, a test that is used to detect if external cells have an influence on a selected level includes testing TODO regions to see if they are bounded on all sides by elements 410, or spaces that conform to dimensional rules 430. In one embodiment, if the type of element or region located on an edge of a TODO region is not known, a further modification to the hierarchy is performed before edges of elements are moved. In one embodiment, if a TODO region abuts a TODO region from another level, a further modification to the hierarchy is performed before edges of elements are moved.

Figure 5:
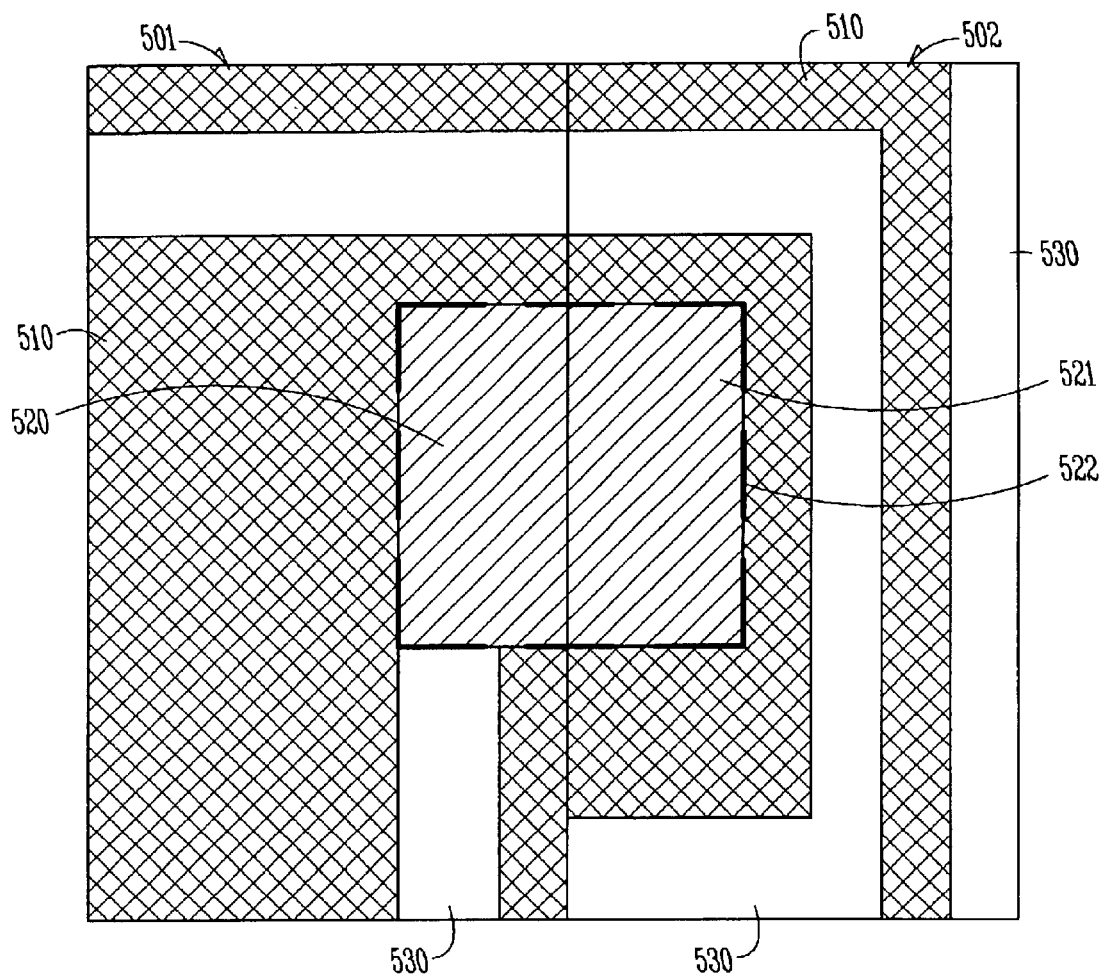
FIG. 5 shows another pair of cells after a modification.

FIG. 5 shows a first cell 501 and a second cell 502. The first cell 501 abuts the second cell 502 along line 503. The cells 501 and 502 contain data for forming a number of elements 510, a first TODO region 520, a second TODO region 521, and a number of spaces that conform to dimensional rules 530. In FIG. 5, the first cell 501 is selected for a modification such as edge movement of elements 510 adjacent the TODO region. The first TODO region 520 is identified because when looking only at the first cell 501, the type of element or region located on an edge of the first TODO region 520 is not known.

In one embodiment, identified regions such as TODO region 520 and 521 are moved into higher level cells in the hierarchy until the identified regions are bounded by a ring 522. In one embodiment FIG. 5 shows a level of the hierarchy that is sufficiently high to show both first cell 501 and second cell 502. The first TODO region 520 and the second TODO region 521 have been removed from lower level cells where they were identified as potential problem regions. The first TODO region 520 and the second TODO region 521 are now bounded only by known regions such as elements 510 or spaces that conform to dimensional rules 530. The ring 522 indicates this desirable condition. In one embodiment, the cells on a given level are in condition for edge movement once a ring 522 is established where no other portions of a TODO region are abutting the ring and outside the ring.

The procedure of cell "leveling" as described above ensures that undesirable results such as electrical shorts as described in FIGS. 3A–3C do not occur during an edge movement procedure. Further, the procedure of cell "leveling" as described above remove the need to create extra cells during the edge moving process. Further, the procedure of cell "leveling" as described above reduces the processor time needed for moving edges of elements from around 7 hours to approximately 30 minutes.

Figure 6:
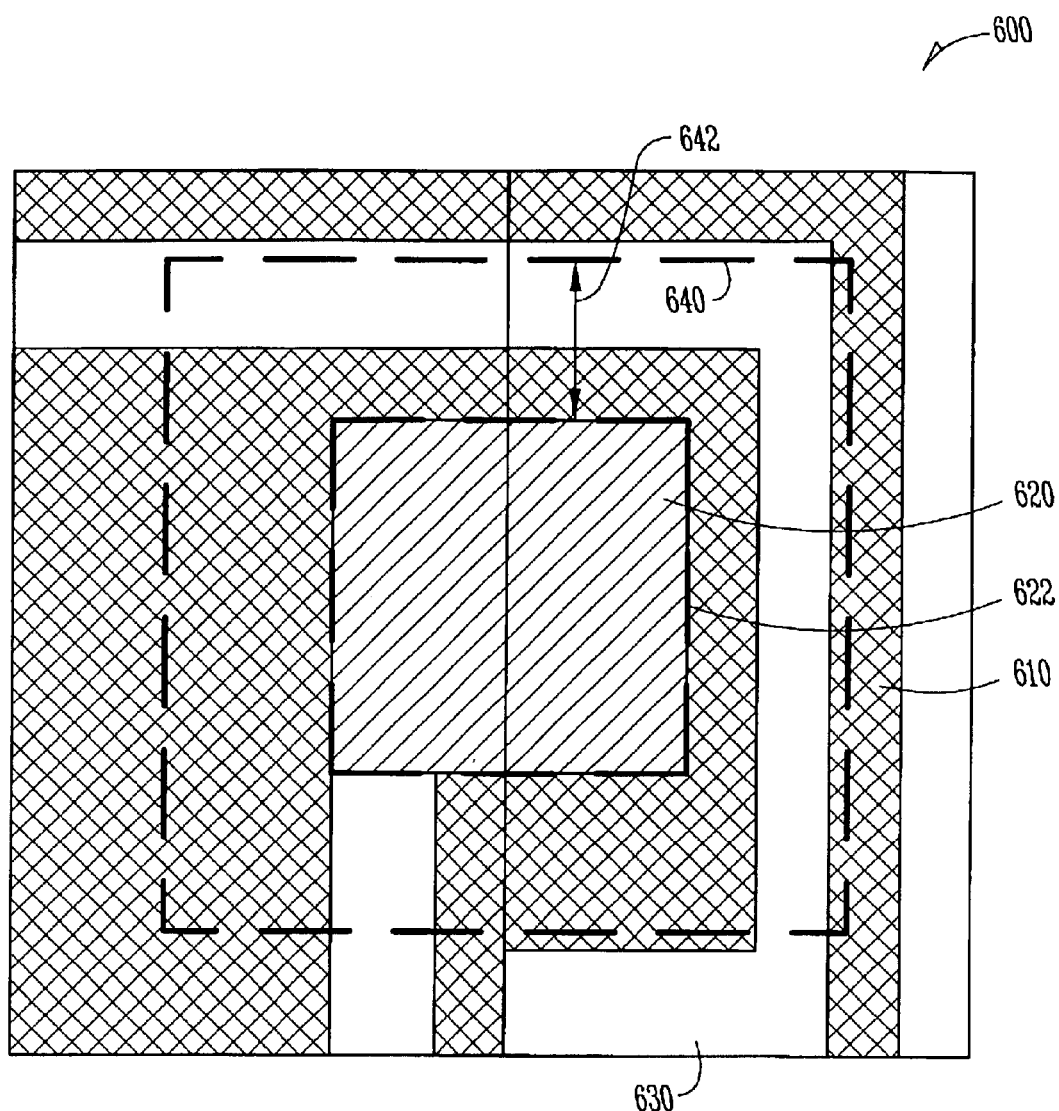
FIG. 6 shows another pair of cells.

FIG. 6 shows a cell pattern 600. The cell pattern 600 includes a number of elements 610, a TODO region 620 and a number of spaces that conform to dimensional rules 630. In one embodiment, the cell pattern 600 has been "leveled" according to the methods described above. The TODO region 620 in one embodiment is made up of portions of TODO regions from lower level cells that have been moved out of the low level cells and into the cell pattern 600. In one embodiment, additional structures such as selected elements 610 have also been moved out of their respective lower level cells and into the cell pattern 600. In one embodiment, all structures such as elements 610 are moved to a higher level cell in the hierarchy if the structures fall within or abut an area such as the area defined within line 640. In one embodiment, the line 640 is spaced an equal distance 642 away from a ring 622. The ring 622 as described in previous embodiments, defines a TODO region that has known structures on all sides of the TODO region such as elements 610 or spaces that conform to dimensional rules 630. The distance 642 of the line 640, in one embodiment, is defined by line-space considerations as described in co-pending application "Pattern Generation on a Semiconductor Surface." By moving all structures if the structures fall within or abut the area within line 640 further external influences to the selected cell, and specifically the TODO region 620 bounded by the ring 622 are included in one cell on one hierarchy level.

Figure 7:
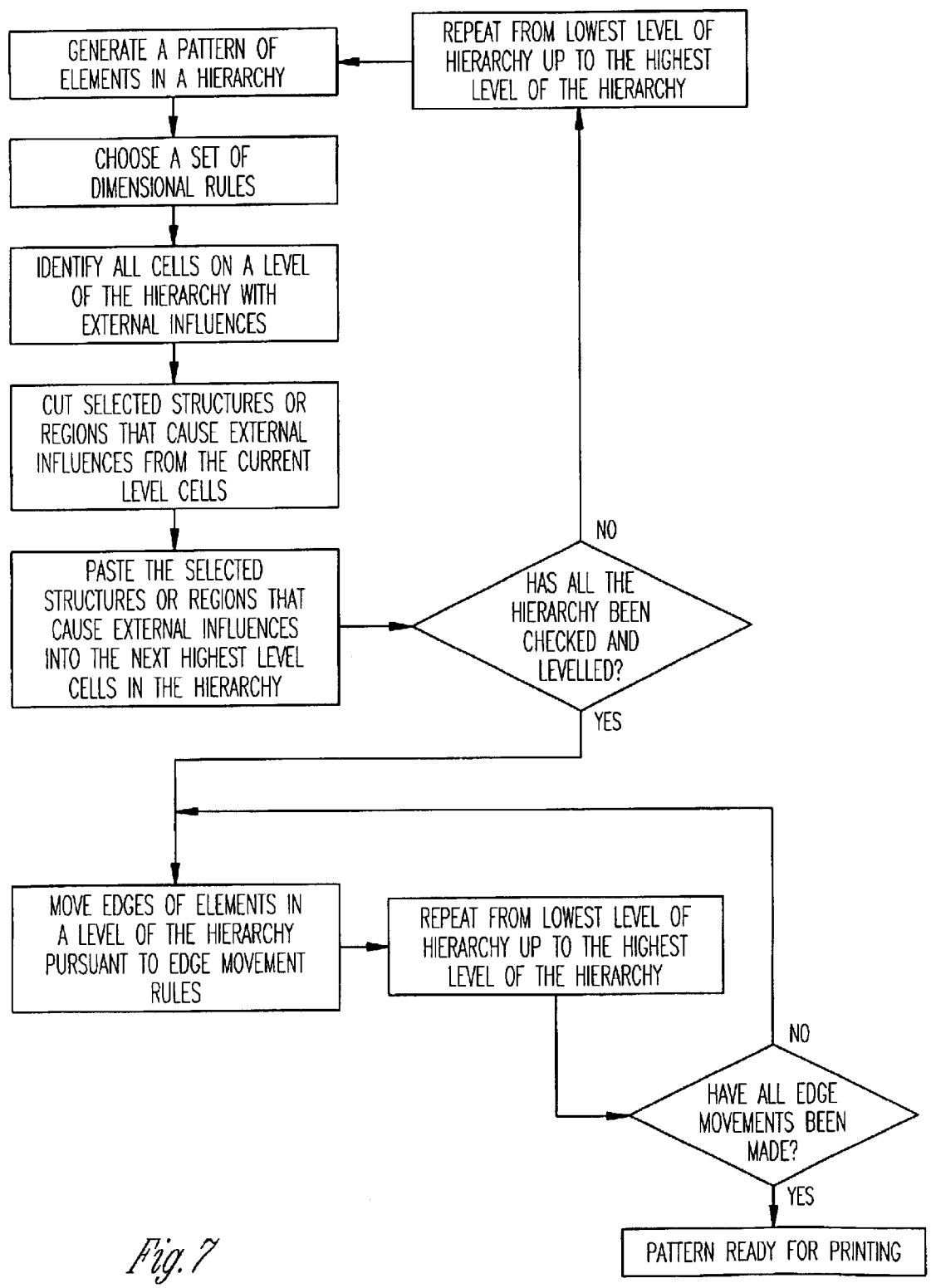
FIG. 7 shows a flow chart of one embodiment of forming a pattern of elements.

FIG. 7 shows a flowchart of one embodiment of forming a pattern of elements using the rules and methods as described above. Identified problem structures or regions are shown as moved from lower level cells into higher level cells before edge movement takes place. Because all cells have been selectively leveled first, substantially all external influences to cells have been removed for each cell before edge movement takes place. The methods and procedures described herein therefore reduce the possibility of undesirable modifications such as electrical shorts. Further, the methods and procedures described herein reduce the number of cells that must be modified by an edge movement step. This factor along with other aspects of the current invention allows the overall processing time of the current method to be substantially reduced over other methods. In one embodiment the processor time for edge movements is reduced from 7 hours to 30 minutes.

Figure 8:
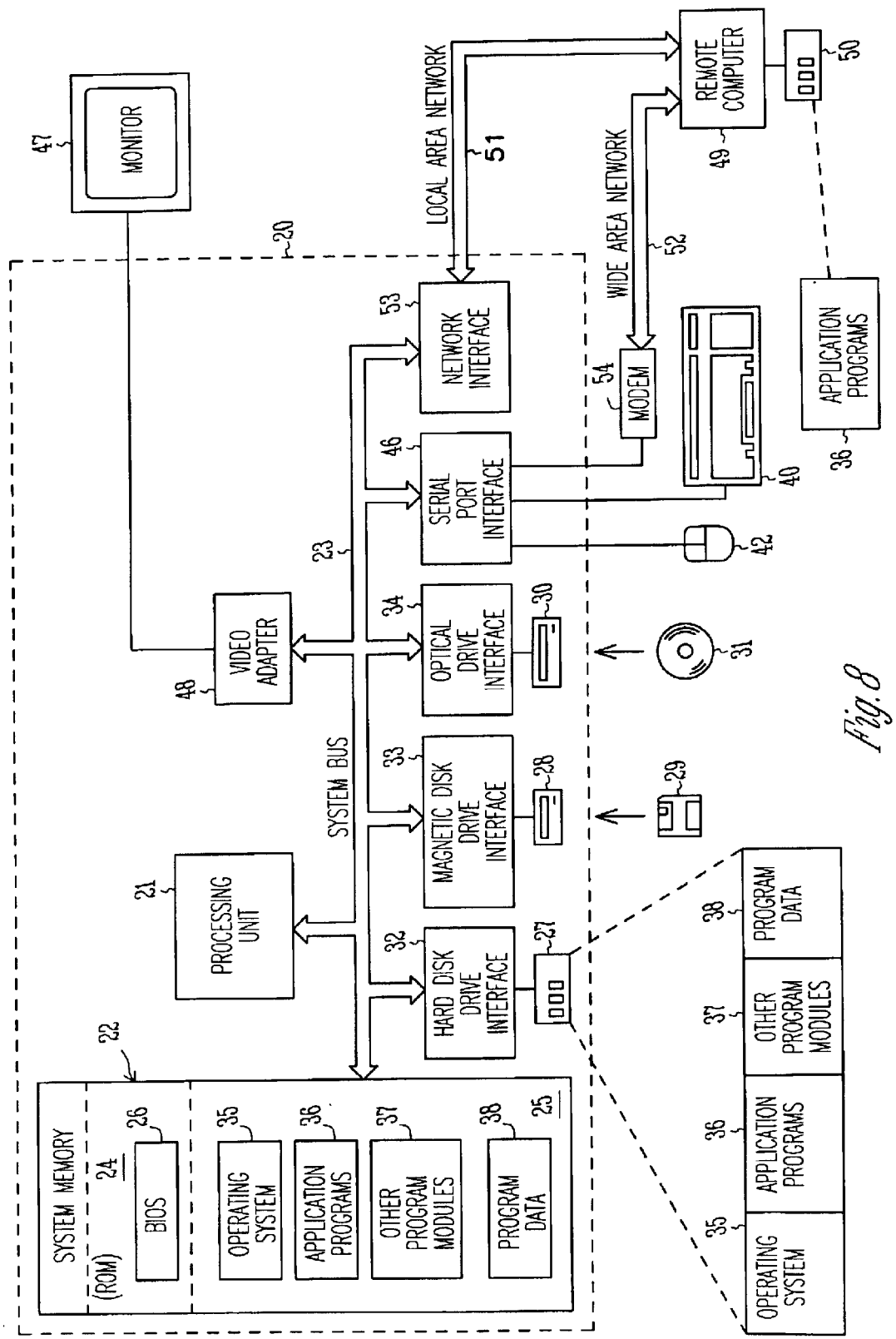
FIG. 8 shows a block diagram of the hardware and operating environment of a suitable computer in conjunction with which embodiments of the invention may be practiced.

FIG. 8 provides a brief, general description of a suitable computing environment in which the above embodiments may be implemented. Embodiments of the invention will hereinafter be described in the general context of computer-executable program modules containing instructions executed by a personal computer (PC). Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network PCs, minicomputers, mainframe computers, and the like which have multimedia capabilities. The invention may also be practiced in distributed computing environments where tasks are performed by remote processing devices linked through a communications network. In a distributed computing environment, program modules may be located in both local and remote memory storage devices.

FIG. 8 shows a general-purpose computing device in the form of a conventional personal computer 20, which includes processing unit 21, system memory 22, and system bus 23 that couples the system memory and other system components to processing unit 21. System bus 23 may be any of several types, including a memory bus or memory controller, a peripheral bus, and a local bus, and may use any of a variety of bus structures. System memory 22 includes read-only memory (ROM) 24 and random-access memory (RAM) 25. A basic input/output system (BIOS) 26, stored in ROM 24, contains the basic routines that transfer information between components of personal computer 20. BIOS 26 also contains start-up routines for the system. Personal computer 20 further includes hard disk drive 27 for reading from and writing to a hard disk (not shown), magnetic disk drive 28 for reading from and writing to a removable magnetic disk 29, and optical disk drive 30 for reading from and writing to a removable optical disk 31 such as a CD-ROM or other optical medium. Hard disk drive 27, magnetic disk drive 28, and optical disk drive 30 are connected to system bus 23 by a hard-disk drive interface 32, a magnetic-disk drive interface 33, and an optical-drive interface 34, respectively. The drives and their associated computer-readable media provide nonvolatile storage of computer-readable instructions, data structures, program modules and other data for personal computer 20. Although the exemplary environment described herein employs a hard disk, a removable magnetic disk 29 and a removable optical disk 31, those skilled in the art will appreciate that other types of computer-readable media which can store data accessible by a computer may also be used in the exemplary operating environment. Such media may include magnetic cassettes, flash-memory cards, digital versatile disks, Bernoulli cartridges, RAMs, ROMs, and the like.

Program modules may be stored on the hard disk, magnetic disk 29, optical disk 31, ROM 24 and RAM 25. Program modules may include operating system 35, one or more application programs 36, other program modules 37, and program data 38. A user may enter commands and information into personal computer 20 through input devices such as a keyboard 40 and a pointing device 42. Other input devices (not shown) may include a microphone, joystick, game pad, satellite dish, scanner, or the like. These and other input devices are often connected to the processing unit 21 through a serial-port interface 46 coupled to system bus 23; but they may be connected through other interfaces not shown in FIG. 9, such as a parallel port, a game port, or a universal serial bus (USB). A monitor 47 or other display device also connects to system bus 23 via an interface such as a video adapter 48. In addition to the monitor, personal computers typically include other peripheral output devices (not shown) such as speakers and printers. In one embodiment, one or more speakers 57 or other audio output transducers are driven by sound adapter 56 connected to system bus 23.

Personal computer 20 may operate in a networked environment using logical connections to one or more remote computers such as remote computer 49. Remote computer 49 may be another personal computer, a server, a router, a network PC, a peer device, or other common network node. It typically includes many or all of the components described above in connection with personal computer 20; however, only a storage device 50 is illustrated in FIG. 9. The logical connections depicted in FIG. 9 include local-area network (LAN) 51 and a wide-area network (WAN) 52. Such networking environments are commonplace in offices, enterprise-wide computer networks, intranets and the Internet.

When placed in a LAN networking environment, PC 20 connects to local network 51 through a network interface or adapter 53. When used in a WAN networking environment such as the Internet, PC 20 typically includes modem 54 or other means for establishing communications over network 52. Modem 54 may be internal or external to PC 20, and connects to system bus 23 via serial-port interface 46. In a networked environment, program modules, such as those comprising Microsoft® Word which are depicted as residing within 20 or portions thereof may be stored in remote storage device 50. Of course, the network connections shown are illustrative, and other means of establishing a communications link between the computers may be substituted.

Software that may be used with embodiments of the invention as described above include, but are not limited to software programs such as HERCULES, AVANTI, CADENCE, DIVA, and SKILL. Software may be designed using many different methods, including object oriented programming methods. C++ and Java are two examples of common object oriented computer programming languages that provide functionality associated with object oriented programming. Object oriented programming methods provide a means to encapsulate data members (variables) and member functions (methods) that operate on that data into a single entity called a class. Object oriented programming methods also provide a means to create new classes based on existing classes.

An object is an instance of a class. The data members of an object are attributes that are stored inside the computer memory, and the methods are executable computer code that act upon this data, along with potentially providing other services. The notion of an object is exploited in the present invention in that certain aspects of the invention are implemented as objects in one embodiment.

An interface is a group of related functions that are organized into a named unit. Each interface may be uniquely identified by some identifier. Interfaces have no instantiation, that is, an interface is a definition only without the executable code needed to implement the methods which are specified by the interface. An object may support an interface by providing executable code for the methods specified by the interface. The executable code supplied by the object must comply with the definitions specified by the interface. The object may also provide additional methods. Those skilled in the art will recognize that interfaces are not limited to use in or by an object oriented programming environment.

Conclusion

Computers and computer-executable program modules, etc are used in one embodiment of the invention to generate patterns as described above for use on a semiconductor surface. The detailed description of the method and associated devices above is used, in one embodiment, to create a reticle for lithography of a semiconductor wafer surface. In one embodiment, a pattern on the reticle is first generated using computer software to interconnect a number of active areas on the wafer. The first pattern is not physically formed, and it's pattern is stored as data for modification as described above. The first pattern is then modified according to the teachings above to create a pattern. In further embodiments, a semiconductor wafer is formed using the reticle generated by the method of the software described above. Elements such as metal trace lines are formed on the wafer in one embodiment, although the invention is not limited to metal trace lines.

In modifying the first pattern of elements, identified problem structures or regions are moved from lower level cells in a hierarchy into higher level cells before edge movement takes place. Because all cells have been selectively leveled first, substantially all external influences to cells have been removed for each cell before edge movement takes place. The methods and procedures described herein therefore reduce the possibility of undesirable modifications such as electrical shorts. Further, the methods and procedures described herein reduce the number of cells that must be modified by an edge movement step. This factor along with other aspects of the current invention allows the overall processing time of the current method to be substantially reduced over other methods. In one embodiment the processor time for edge movements is reduced from 7 hours to 30 minutes.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a pattern of elements for use on a semiconductor wafer, comprising:

generating a number of cells organized in a hierarchy;

identifying a first cell including a region to be modified on a first hierarchy level;

identifying a second cell on a second hierarchy level that influences characteristics of the first cell;

moving at least a portion of the first cell from the first hierarchy level to a higher level cell in the hierarchy that is common with the second cell;

moving at least a portion of the second cell from the second hierarchy level to the higher level cell, wherein the higher level cell is free of external influences; and modifying the higher level cell.

2. The method of claim 1, wherein generating the number of cells includes generating a number of cells that include a number of conductive elements whose edges define a number of spaces between the elements.

3. The method of claim 2, wherein generating the number of cells that include a number of conductive elements includes generating a number of cells that include a number of metal trace lines.

4. The method of claim 1, wherein the first hierarchy level and the second hierarchy level are the same hierarchy level.

5. The method of claim 1, wherein identifying the second cell on the second hierarchy level that influences characteristics of the first cell includes identifying a second cell on a second hierarchy level including a second region to be modified that is adjacent to the first region to be modified.

6. The method of claim 5, wherein prior to modifying the higher level cell, the first region to be modified and the second region to be modified are both isolated from other regions to be modified.

7. A method of forming a pattern of elements for use on a semiconductor wafer, comprising:
generating a number of cells organized in a hierarchy;
testing an area of a first cell, the area surrounding a region to be modified;
identifying a second cell that influences characteristics of the first cell;
moving a portion of the first cell that abuts or is contained within the area from the first cell to a higher level cell in the hierarchy that is common with the second cell;
moving at least a portion of the second cell to the higher level cell in the hierarchy, wherein the higher level cell is free of external influences;
modifying the region to be modified in the higher level cell.

8. The method of claim 7, wherein generating the number of cells includes generating a number of cells that include conductive elements with spaces defined between the conductive elements.

9. The method of claim 8, wherein generating the number of cells that include conductive elements includes generating a number of cells that include metal trace lines.

10. The method of claim 7, wherein the region to be modified includes a space between elements with a space dimension to be modified.

11. The method of claim 7, wherein testing the area of the first cell includes a region which is sized larger than the region to be modified by a test distance.

12. The method of claim 10, wherein testing the area of the first cell includes testing the area of the first cell to identify elements adjacent to the space with a dimension larger that a threshold dimension.

13. The method of claim 7, wherein modifying the region to be modified includes moving edges of elements that are adjacent to the region to be modified.

14. A method of forming a reticle, comprising:
generating a number of cells that form a pattern of elements, the cells being organized in a hierarchy;
identifying a first cell including a region to be modified on a first hierarchy level;
identifying a second cell on a second hierarchy level that influences characteristics of the first cell;
moving at least a portion of the first cell from the first hierarchy level to a higher level cell in the hierarchy that is common with the second cell;
moving at least a portion of the second cell from the second hierarchy level to the higher level cell, wherein the higher level cell is free of external influences;
modifying the region to be modified in the higher level cell; and
printing the pattern of elements on a reticle substrate after modifying the higher level cell.

15. The method of claim 14, wherein generating the number of cells includes generating a number of cells that include a number of conductive elements whose edges define a number of spaces between the elements.

16. The method of claim 15, wherein generating the number of cells that include the number of conductive elements includes generating a number of cells that include a number of metal trace lines.

17. The method of claim 14, wherein the first hierarchy level and the second hierarchy level are the same hierarchy level.

18. The method of claim 14, wherein identifying the second cell on the second hierarchy level that influences characteristics of the first cell includes identifying a second cell on a second hierarchy level including a second region to be modified that is adjacent to the first region to be modified.

19. The method of claim 18, wherein moving at least a portion of the second cell from the second hierarchy level into the first hierarchy level includes moving the second region to be modified from the second hierarchy level into the first hierarchy level.

20. A method of forming a reticle, comprising:
generating a number of cells that form a pattern of elements, the cells being organized in a hierarchy;
testing an area of a first cell, the area surrounding a region to be modified;
identifying a second cell that influences characteristics of the first cell;
moving a portion of the first cell that abuts or is contained within the area from the first cell to a higher level cell in the hierarchy that is common with the second cell;
moving at least a portion of the second cell to the higher level cell in the hierarchy, wherein the higher level cell is free of external influences;
modifying the region to be modified in the higher level cell; and
printing the pattern of elements on a reticle substrate after modifying the region.

21. The method of claim 20, wherein generating the number of cells includes generating a number of cells that include conductive elements with spaces defined between the conductive elements.

22. The method of claim 21, wherein generating the number of cells that include conductive elements includes generating a number of cells that include metal trace lines.

23. The method of claim 20, wherein the region to be modified includes a space between elements with a space dimension to be modified.

24. The method of claim 20, wherein testing the area of the first cell includes a region which is sized larger than the region to be modified by a test distance.

25. The method of claim 23, wherein testing the area of the first cell includes testing the area of the first cell to identify elements adjacent to the space with a dimension larger that a threshold dimension.

26. The method of claim 20, wherein modifying the region to be modified includes moving edges of elements that are adjacent to the region to be modified.

27. A method of forming a pattern of elements on a semiconductor surface, comprising:
forming a reticle, including:
generating a number of cells that form a pattern of elements, the cells being organized in a hierarchy;

identifying a first cell including a region to be modified on a first hierarchy level;

identifying a second cell on a second hierarchy level that influences characteristics of the first cell;

moving at least a portion of the first cell from the first hierarchy level to a higher level cell in the hierarchy that is common with the second cell;

moving at least a portion of the second cell from the second hierarchy level to the higher level cell, wherein the higher level cell is free of external influences; and modifying the higher level cell;

printing the pattern of elements on a reticle substrate after modifying the region; and forming the pattern of elements on a semiconductor surface using the reticle.

28. The method of claim 27, wherein generating the number of cells includes generating a number of cells that include a number of conductive elements whose edges define a number of spaces between the elements.

29. The method of claim 28, wherein generating the number of cells that include a number of conductive elements includes generating a number of cells that include a number of metal trace lines.

30. The method of claim 27, wherein the first hierarchy level and the second hierarchy level are the same hierarchy level.

31. The method of claim 27, wherein identifying the second cell on the second hierarchy level that influences characteristics of the first cell includes identifying a second cell on a second hierarchy level including a second region to be modified that is adjacent to the first region to be modified.

32. The method of claim 31, wherein prior to modifying the higher level cell, the first region to be modified and the second region to be modified are both isolated from other regions to be modified.

33. The method of claim 27, wherein printing the pattern of elements on a reticle substrate includes printing the pattern of elements for a positive resist on a reticle substrate.

34. A method of forming a pattern of elements on a semiconductor surface, comprising:

forming a reticle, including:
generating a number of cells that form a pattern of elements, the cells being organized in a hierarchy;
testing an area of a first cell, the area surrounding a region to be modified;
identifying a second cell that influences characteristics of the first cell;
moving a portion of the first cell that abuts or is contained within the area from the first cell to a higher level cell in the hierarchy that is common with the second cell;
moving at least a portion of the second cell to the higher level cell in the hierarchy, wherein the higher level cell is free of external influences;
modifying the region to be modified in the higher level cell;
printing the pattern of elements on a reticle substrate after modifying the region; and
forming the pattern of elements on a semiconductor surface using the reticle.

35. The method of claim 34, wherein generating the number of cells includes generating a number of cells that include conductive elements with spaces defined between the conductive elements.

36. The method of claim 35, wherein generating the number of cells that include conductive elements includes generating a number of cells that include metal trace lines.

37. The method of claim 34, wherein the region to be modified includes a space between elements with a space dimension to be modified.

38. The method of claim 34, wherein testing the area of the first cell includes a region which is sized larger than the region to be modified by a test distance.

39. The method of claim 37, wherein testing the area of the first cell includes testing the area of the first cell to identify elements adjacent to the space with a dimension larger that a threshold dimension.

40. The method of claim 34, wherein modifying the region to be modified includes moving edges of elements that are adjacent to the region to be modified.

41. The method of claim 34, wherein printing the pattern of elements on a reticle substrate includes printing the pattern of elements for a positive resist on a reticle substrate.

42. A machine-readable medium with instructions stored thereon, the instructions when executed operable to cause:

generation of a number of cells organized in a hierarchy;
identification of a first cell including a region to be modified on a first hierarchy level;
identification of a second cell on a second hierarchy level that influences characteristics of the first cell;
moving of at least a portion of the first cell from the first hierarchy level to a higher level cell in the hierarchy that is common with the second cell;
moving of at least a portion of the second cell from the second hierarchy level to the higher level cell, wherein the higher level cell is free of external influences; and
modification of the higher level cell.

43. The machine-readable medium of claim 42, wherein generation of the number of cells includes generation of a number of cells that include a number of conductive elements whose edges define a number of spaces between the elements.

44. The machine-readable medium of claim 43, wherein generation of the number of cells that include the number of conductive elements includes generation of a number of cells that include a number of metal trace lines.

45. The machine-readable medium of claim 42, wherein the first hierarchy level and the second hierarchy level are the same hierarchy level.

46. The machine-readable medium of claim 42, wherein identification of the second cell on the second hierarchy level that influences characteristics of the first cell includes identification of a second cell on a second hierarchy level including a second region to be modified that is adjacent to the first region to be modified.

47. The machine-readable medium of claim 46, wherein prior to modification of the higher level cell, the first region to be modified and the second region to be modified are both isolated from other regions to be modified.

48. A machine-readable medium with instructions stored thereon, the instructions when executed operable to cause:

generation of a number of cells organized in a hierarchy;
testing of an area of a first cell, the area surrounding a region to be modified;
identification of a second cell that influences characteristics of the first cell;
moving of a portion of the first cell that abuts or is contained within the area from the first cell to a higher level cell in the hierarchy that is common with the second cell;
moving of at least a portion of the second cell to the higher level cell in the hierarchy, wherein the higher level cell is free of external influences;

modification of the region to be modified in the higher level cell.

49. The machine-readable medium of claim 48, wherein generation of the number of cells includes generation of a number of cells that include conductive elements with spaces defined between the conductive elements.

50. The machine-readable medium of claim 49, wherein generation of the number of cells that include conductive elements includes generation of a number of cells that include metal trace lines.

51. The machine-readable medium of claim 48, wherein the region to be modified includes a space between elements with a space dimension to be modified.

52. The machine-readable medium of claim 48, wherein testing of the area of the first cell includes a region which is sized larger than the region to be modified by a test distance.

53. The machine-readable medium of claim 51, wherein testing of the area of the first cell includes testing of the area of the first cell to identify elements adjacent to the space with a dimension larger that a threshold dimension.

54. The machine-readable medium of claim 48, wherein modification of the region to be modified includes moving of edges of elements that are adjacent to the region to be modified.

55. A pattern generating system, comprising:
   a processor;
   a memory, containing instructions thereon, the instructions when executed operable to cause:
      generation of a number of cells organized in a hierarchy;
      identification of a first cell including a region to be modified on a first hierarchy level;
      identification of a second cell on a second hierarchy level that influences characteristics of the first cell;
      moving of at least a portion of the first cell from the first hierarchy level to a higher level cell in the hierarchy that is common with the second cell;
      moving of at least a portion of the second cell from the second hierarchy level to the higher level cell, wherein the higher level cell is free of external influences; and
      modification of the higher level cell.

56. The pattern generating system of claim 55, wherein generation of the number of cells includes generation of a number of cells that include a number of conductive elements whose edges define a number of spaces between the elements.

57. The pattern generating system of claim 56, wherein generation of the number of cells that include a number of conductive elements includes generation of a number of cells that include a number of metal trace lines.

58. The pattern generating system of claim 55, wherein the first hierarchy level and the second hierarchy level are the same hierarchy level.

59. The pattern generating system of claim 55, wherein identification of the second cell on the second hierarchy level that influences characteristics of the first cell includes identification of a second cell on a second hierarchy level including a second region to be modified that is adjacent to the first region to be modified.

60. The pattern generating system of claim 59, wherein prior to modification of the higher level cell, the first region to be modified and the second region to be modified are both isolated from other regions to be modified.

61. A pattern generating system, comprising:
   a processor;
   a memory, containing instructions thereon, the instructions when executed operable to cause:
      generation of a number of cells organized in a hierarchy;
      testing of an area of a first cell, the area surrounding a region to be modified;
      identification of a second cell that influences characteristics of the first cell;
      moving of a portion of the first cell that abuts or is contained within the area from the first cell to a higher level cell in the hierarchy that is common with the second cell;
      moving of at least a portion of the second cell to the higher level cell in the hierarchy, wherein the higher level cell is free of external influences;
      modification of the region to be modified in the higher level cell.

62. The pattern generating system of claim 61, wherein generation of the number of cells includes generation of a number of cells that include conductive elements with spaces defined between the conductive elements.

63. The pattern generating system of claim 62, wherein generation of the number of cells that include conductive elements includes generation of a number of cells that include metal trace lines.

64. The pattern generating system of claim 61, wherein the region to be modified includes a space between elements with a space dimension to be modified.

65. The pattern generating system of claim 61, wherein testing of the area of the first cell includes a region which is sized larger than the region to be modified by a test distance.

66. The pattern generating system of claim 64, wherein testing of the area of the first cell includes testing of the area of the first cell to identify elements adjacent to the space with a dimension larger that a threshold dimension.

67. The pattern generating system of claim 61, wherein modification of the region to be modified includes moving of edges of elements that are adjacent to the region to be modified.

* * * * *